(12) United States Patent
Calzia et al.

(10) Patent No.: US 8,563,088 B2
(45) Date of Patent: *Oct. 22, 2013

(54) SELENIUM/GROUP 1B INK AND METHODS OF MAKING AND USING SAME

(71) Applicant: Rohm and Haas Electronic Materials LLC, Marlborough, MA (US)

(72) Inventors: Kevin Calzia, Maynard, MA (US); David Mosley, Philadelphia, PA (US); David L. Thorsen, Pitman, NJ (US); Charles R. Szmanda, Westborough, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/650,672

(22) Filed: Oct. 12, 2012

(65) Prior Publication Data

US 2013/0040419 A1    Feb. 14, 2013

Related U.S. Application Data

(62) Division of application No. 12/568,206, filed on Sep. 28, 2009, now Pat. No. 8,309,179.

(51) Int. Cl.
*B05D 3/02* (2006.01)
*C09D 11/00* (2006.01)

(52) U.S. Cl.
USPC .... 427/380; 106/1.05; 106/31.13; 106/31.92; 252/500; 257/42; 257/E21.068; 257/E21.09; 257/E21.114; 257/E29.296; 427/384; 438/95; 438/102; 438/197; 438/285; 438/478; 438/590; 438/602

(58) Field of Classification Search
USPC ............... 106/1.05, 31.13, 31.92; 252/500; 257/42, E21.068, E21.09, E21.114, 257/E29.296; 427/380, 384; 438/95, 102, 438/197, 285, 478, 590, 602
See application file for complete search history.

(56) References Cited

U.S. PATENT DOCUMENTS

| | | | |
|---|---|---|---|
| 8,282,995 B2 * | 10/2012 | Calzia et al. ............... | 427/380 |
| 2006/0041170 A1 * | 2/2006 | Jonas et al. ............... | 564/463 |
| 2009/0260670 A1 * | 10/2009 | Li ............................... | 136/244 |

* cited by examiner

*Primary Examiner* — Bijan Ahvazi
(74) *Attorney, Agent, or Firm* — Thomas S. Deibert

(57) ABSTRACT

A method for preparing a Group 1a-1b-3a-6a material using a selenium/Group 1b ink comprising, as initial components: a selenium component comprising selenium, an organic chalcogenide component having a formula selected from RZ—Z'R' and $R^2$—SH, a Group 1b component and a liquid carrier; wherein Z and Z' are each independently selected from sulfur, selenium and tellurium; wherein R is selected from H, $C_{1-20}$ alkyl group, a $C_{6-20}$ aryl group, a $C_{1-20}$ alkylhydroxy group, an arylether group and an alkylether group; wherein R' and $R^2$ are selected from a $C_{1-20}$ alkyl group, a $C_{6-20}$ aryl group, a $C_{1-20}$ alkylhydroxy group, an arylether group and an alkylether group; and wherein the selenium/Group 1b ink is a stable dispersion.

3 Claims, No Drawings

SELENIUM/GROUP 1B INK AND METHODS OF MAKING AND USING SAME

This application is a divisional of U.S. patent application Ser. No. 12/568,206 filed Sep. 28, 2009.

The present invention relates to a selenium/Group 1b ink comprising, as initial components: a selenium component comprising selenium, an organic chalcogenide component having a formula selected from RZ—Z'R' and $R^2$—SH; and a Group 1b component stably dispersed in a liquid carrier. The present invention further relates to a method of preparing the selenium/Group 1b ink and for using the selenium/Group 1b ink to deposit $M_aSe_h$ on a substrate.

Metal chalcogenides that exhibit semiconductive properties have applications in the manufacture of electronics and electro-optical devices. One very promising application for metal chalcogenides is in the manufacture of photovoltaic cells for the conversion of sunlight into electricity. In particular, the use of selenium and Group 1b materials in the manufacture of photovoltaic cells based on Group 1a-1b-3a-6a mixed-metal chalcogenide materials, including for example, copper-indium-diselenide ($CuInSe_2$), copper-gallium-diselenide ($CuGaSe_2$) and copper-indium-gallium-diselenide ($CuIn_{1-x}Ga_xSe_2$), are of considerable interest because of their high solar energy to electrical energy conversion efficiencies. The Group 1a-1b-3a-6a mixed metal chalcogenide semiconductors are sometimes referred to generically as CIGS materials. Conventional CIGS solar cells include a back electrode followed by a layer of molybdenum, a CIGS absorber layer, a CdS junction partner layer, and a transparent conductive oxide layer electrode (e.g., $ZnO_x$ or $SnO_2$); wherein the molybdenum layer is deposited over the back electrode, the CIGS absorber layer is interposed between the molybdenum layer and the CdS junction partner and the CdS junction partner is interposed between the CIGS absorber layer and the transparent conductive oxide layer electrode.

One challenge for this promising technology is the development of cost-effective manufacturing techniques for producing the CIGS materials. Conventional methods for depositing selenium typically involve the use of vacuum-based processes, including, for example, vacuum-evaporation, sputtering and chemical vapor deposition. Such deposition techniques exhibit low throughput capabilities and high cost. To facilitate the large scale, high throughput, low cost, manufacture of selenium containing CIGS materials, it would be desirable to provide liquid based deposition techniques.

One approach for the electroless deposition of $Cu_3Se_2$ and CuSe films is disclosed by Pejova, et al. in *Chemical Deposition and Characterization of $Cu_3Se_2$ and CuSe Thin Films*, JOURNAL OF SOLID STATE CHEMISTRY, vol. 158, pp. 49-54 (2001) ("Pejova"). Pejova discloses the growth of $Cu_3Se_2$ and CuSe films based on the decomposition of selenosulfate in alkaline solutions containing copper (II) salt and a complexing agent.

Notwithstanding, there remains a need for a selenium/Group 1b ink for use in the manufacture of CIGS materials. In particular, a selenium/Group 1b ink that facilitates the deposition of a $M_aSe_h$ material, wherein the mole ratio of M to Se in the deposited $M_aSe_h$ material is tailorable.

In one aspect of the present invention, there is provided a selenium/Group 1b ink, comprising, as initial components: a selenium component comprising selenium; an organic chalcogenide component having a formula selected from RZ—Z'R' and $R^2$—SH; wherein Z and Z' are each independently selected from sulfur, selenium and tellurium; wherein R is selected from H, $C_{1-20}$ alkyl group, a $C_{6-20}$ aryl group, a $C_{1-20}$ alkylhydroxy group, an arylether group and an alkylether group; wherein R' and $R^2$ are selected from a $C_{1-20}$ alkyl group, a $C_{6-20}$ aryl group, a $C_{1-20}$ alkylhydroxy group, an arylether group and an alkylether group; a Group 1b component, comprising at least one Group 1b material selected from copper and silver complexed with a multidentate ligand; a liquid carrier; wherein the selenium/Group 1b ink is a stable dispersion.

In another aspect of the present invention, there is provided a method of preparing a selenium/Group 1b ink of the present invention, comprising: providing a selenium component, comprising selenium; providing an organic chalcogenide component having a formula selected from RZ—Z'R' and $R^2$—SH; wherein Z and Z' are each independently selected from sulfur, selenium and tellurium; wherein R is selected from H, $C_{1-20}$ alkyl group, a $C_{6-20}$ aryl group, a $C_{1-20}$ alkylhydroxy group, an arylether group and an alkylether group; wherein R' and $R^2$ are selected from a $C_{1-20}$ alkyl group, a $C_{6-20}$ aryl group, a $C_{1-20}$ alkylhydroxy group, an arylether group and an alkylether group; providing a liquid carrier; combining the selenium component, the organic chalcogenide component and the liquid carrier; heating the combination with agitation to produce a combined selenium/organic chalcogenide component; providing a Group 1b component, comprising at least one Group 1b material selected from copper and silver complexed with a multidentate ligand; and, combining the combined selenium/organic chalcogenide component and the Group 1b component to form the selenium/Group 1b ink; wherein the selenium/Group 1b ink is a stable dispersion.

In another aspect of the present invention, there is provided a method for preparing a Group 1a-1b-3a-6a material, comprising: providing a substrate; optionally, providing a Group 1a source comprising sodium; providing a selenium/Group 1b ink of the present invention; providing a Group 3a source; optionally, providing a Group 6a source; forming at least one Group 1a-1b-3a-6a precursor material on the substrate by optionally using the Group 1a source to apply sodium to the substrate; using the selenium/Group 1b source to apply selenium and a Group 1b material to the substrate; using the Group 3a source to apply a Group 3a material to the substrate; optionally, using the Group 6a source to apply at least one of sulfur and selenium to the substrate; treating the precursor material to form a Group 1a-1b-3a-6a material having a formula $Na_LX_mY_nS_pSe_q$; wherein X is at least one Group 1b element selected from copper and silver; Y is at least one Group 3a element selected from aluminum, gallium and indium; $0 \le L \le 0.75$; $0.25 \le m \le 1.5$; n is 1; $0 \le p < 2.5$; $0 < q \le 2.5$; and, $1.8 \le (p+q) \le 2.5$.

DETAILED DESCRIPTION

The term "stable" as used herein and in the appended claims in reference to the selenium/Group 1b ink means that the selenium and the Group 1b material do not form a precipitate during storage of the selenium/Group 1b ink at 22° C. under nitrogen for a period of at least thirty (30) minutes.

The term "storage stable" as used herein and in the appended claims in reference to the selenium/Group 1b ink means that the selenium and the Group 1b material do not form a precipitate during storage of the selenium/Group 1b ink at 22° C. under nitrogen for a period of at least sixteen (16) hours.

The term "extended stability" as used herein and in the appended claims in reference to the selenium/Group 1b ink means that the selenium and the Group 1b material do not form a precipitate during storage of the selenium/Group 1b ink at 22° C. under nitrogen for a period of at least 5 days.

The term "hydrazine free" as used herein and in the appended claims in reference to the selenium/Group 1b ink means that the selenium/Group 1b ink contains <100 ppm hydrazine.

The term "hydrazinium free or $(N_2H_5)^+$ free" as used herein and in the appended claims in reference to the selenium/Group 1b ink means that the selenium/Group 1b ink contains <100 ppm hydrazinium complexed with selenium.

The selenium component of the present invention comprises selenium. Preferably, the selenium component is selenium.

The optional organic chalcogenide component has a formula selected from RZ—Z'R' and $R^2$—SH; wherein Z and Z' are each independently selected from sulfur, selenium and tellurium (preferably sulfur and selenium; most preferably sulfur); wherein R is selected from H, a $C_{1-20}$ alkyl group, a $C_{6-20}$ aryl group, a $C_{1-20}$ alkylhydroxy group, an arylether group and an alkylether group (preferably R is selected from a $C_{1-20}$ alkyl group, a $C_{6-20}$ aryl group, a $C_{1-20}$ alkylhydroxy group, a $C_{7-20}$ arylether group and a $C_{3-20}$ alkylether group; more preferably R is selected from a $C_{1-20}$ alkyl group and a $C_{6-20}$ aryl group; still more preferably R is a $C_{1-10}$ alkyl group; most preferably R is a $C_{1-5}$ alkyl group); wherein R' is selected from a $C_{1-20}$ alkyl group, a $C_{6-20}$ aryl group, a $C_{1-20}$ alkylhydroxy group, an arylether group and an alkylether group (preferably R' is selected from a $C_{1-20}$ alkyl group, a $C_{6-20}$ aryl group, a $C_{1-20}$ alkylhydroxy group, a $C_{7-20}$ arylether group and a $C_{3-20}$ alkylether group; more preferably R' is selected from a $C_{1-20}$ alkyl group and a $C_{6-20}$ aryl group; still more preferably R' is a $C_{1-10}$ alkyl group; most preferably R' is a $C_{1-5}$ alkyl group). Optionally, R, R' and $R^2$ are selected to enhance the solubility of the organic chalcogenide in the liquid carrier.

The optional organic chalcogenide component is believed to provide the selenium/Group 1b ink of the present invention with enhanced stability. The molar ratio of selenium to the organic chalcogenide having a formula selected from RZ—Z'R' and $R^2$—SH in the selenium/Group 1b ink is selected to tailor the properties of the selenium/Group 1b ink as desired. Without wishing to be bound by theory, it is believed that a higher molar ratio of organic chalcogenide having a formula selected from RZ—Z'R' and $R^2$—SH to selenium in the selenium/Group 1b ink of the present invention correlates with greater stability of the selenium/Group 1b ink. Preferably, the molar ratio of selenium to the organic chalcogenide having a formula selected from RZ—Z'R' and $R^2$—SH in the selenium/Group 1b ink is 2:1 to 20:1, more preferably 2:1 to 14:1, still more preferably 2:1 to 10:1, most preferably 2:1 to 6:1.

Optionally, Z and Z' are both sulfur. Preferably, when both Z and Z' are sulfur, R and R' are each independently selected from a phenyl group, a methyl group, an ethyl group, a propyl group, an isopropyl group, a n-butyl group and a tert-butyl group. More preferably, when both Z and Z' are sulfur, R and R' are each independently selected from a n-butyl group and a tert-butyl group. Most preferably, when both Z and Z' are sulfur, R and R' are both a tert-butyl group.

Optionally, Z and Z' are both selenium. Preferably, when both Z and Z' are selenium, R and R' are each independently selected from a phenyl group, a methyl group, an ethyl group, a propyl group, a butyl group, an isopropyl group and a tert-butyl group. More preferably, when both Z and Z' are selenium, R and R' are both a phenyl group.

Optionally, the selenium component and the organic chalcogenide component are combined to form a selenium/organic chalcogenide component. Optionally, the combined selenium/organic chalcogenide component comprises, a chemical compound having a formula RZ—$Se_t$—Z'R' dispersed in a liquid carrier; wherein Z and Z' are as previously described; wherein R and R' are as previously described; wherein t is 2 to 20 (preferably 2 to 14; more preferably 2 to 10; most preferably 2 to 6); wherein the selenium component comprises ≥1 wt % selenium; wherein the selenium component is a stable dispersion and wherein the selenium component is hydrazine and hydrazinium free.

The Group 1b component used in the selenium/Group 1b ink of the present invention include any conventional vehicles for depositing a Group 1b material on a substrate using liquid deposition techniques and that result in a stable selenium/Group 1b ink. The Group 1b component comprises: (a) at least one Group 1b ion selected from a copper ion and a silver ion; preferably a copper ion; most preferably a copper (II) ion; and (b) a multidentate ligand coordinated with to the Group 1b ion. Without wishing to be bound by theory, it is believed that, relatively speaking, the use of higher denticity ligands in the preparation of the Group 1b component decreases the reactivity of the Group 1b material in the Group 1b component with selenium in the selenium component while the selenium component and the Group 1b component are dispersed in the liquid carrier (e.g., tridentate ligands result in higher stability relative to bidentate or monodentate ligands). It is believed that higher denticity ligands exhibit a higher affinity for the Group 1b material in the Group 1b component and are therefore more difficult for selenium to displace from the Group 1b material while dispersed in the liquid carrier.

Multidentate ligands used in the Group 1b complex include organic compounds containing at least two bonding groups selected from amine, imine, nitrile, phosphorous, sulfur, oxygen, selenol and carboxylate. Optionally, the Group 1b complex includes at least one multidentate ligand having at least two nitrogen bonding groups (preferably amine groups). Optionally, the Group 1b complex includes at least one multidentate ligand selected from ethylene diamine; diethylenetriamine; tris(2-aminoethyl)amine; triethylenetetramine; tetraethylenepentamine; 1,2-diaminocyclohexane; Shiff bases (e.g., the adduct of salicylic aldehyde and ethylene diamine (Salen ligands) and the adduct of acetylacetone and ethylene diamine (Acene ligands)); phenathroline; bipyridine; multidentate phosphines (e.g., diphenylphosphinoethane) and multidentate phosphites. Preferably, the Group 1b complex includes at least one multidentate ligand having at least three bonding groups. More preferably, the Group 1b complex includes at least one multidentate ligand having at least three bonding groups selected from amine, imine, nitrile, phosphorous, sulfur, oxygen, selenol and carboxylate; (preferably amine groups). Still more preferably, the Group 1b complex includes at least one multidentate ligand having at least three bonding groups, wherein the at least one multidentate ligand is selected from diethylenetriamine; tris(2-aminoethyl)amine; triethylenetetramine; tetraethylenepentamine and tetramethylguanidine. Yet still more preferably, the Group 1b complex includes at least one multidentate ligand having at least three bonding groups, wherein the at least one multidentate ligand is selected from diethylenetriamine and tris(2-aminoethyle)amine. Most preferably, the Group 1b complex includes at least one multidentate ligand having at least three bonding groups, wherein the at least one multidentate ligand is selected from diethylenetriamine and tris(2-aminoethyl)amine. Optionally, the Group 1b complex includes at least one tris(2-aminoethyl)amine ligand. Optionally, the Group 1b complex includes at least one diethylenetriamine ligand.

Liquid carrier used in the selenium/Group 1b ink of the present invention can be any solvent in which the selenium component and the Group 1b component are both stably dispersable. Optionally, the liquid carrier used is selected from water, ethers, polyethers, amide solvents (e.g., dimethylformamide, dimethylacetamide), N-methylpyrrolidone, keto-solvents (e.g., methylisobutylketone), aryl solvents (e.g., toluene), cresols and xylene. Optionally, the liquid carrier used is selected from ethers, polyethers, amide solvents (e.g., dimethylformamide, dimethylacetamide), N-methylpyrrolidone, keto-solvents (e.g., methylisobutylketone), aryl solvents (e.g., toluene), cresols, xylene and mixtures thereof. Optionally, the liquid carrier is a nitrogen containing solvent or a combination of nitrogen containing solvents. Optionally, the liquid carrier used comprises a liquid amine having a formula $NR_3$, wherein each R is independently selected from a H, a $C_{1-10}$ alkyl group, a $C_{6-10}$ aryl group, a $C_{3-10}$ cycloalkylamino group (e.g., 1,2-diamino cyclohexane) and a $C_{1-10}$ alkylamino group. Optionally, the liquid carrier used in the preparation of the selenium/Group 1b ink of the present invention is selected from ethylene diamine; diethylenetriamine; tris(2-aminoethyl)amine; triethylenetetramine; n-butylamine; n-hexylamine; octylamine; 2-ethyl-1-hexylamine; 3-amino-1-propanol; 1,3-diaminopropane; 1,2-diaminopropane; 1,2-diaminocyclohexane; pyridine; pyrrolidine; 1-methylimidazole; tetramethylguanidine and mixtures thereof. Optionally, the liquid carrier is selected from ethylene diamine, diethylenetriamine, tris(2-aminoethyl)amine; triethylenetetramine, n-hexylamine, pyrrolidine, n-butylamine and mixtures thereof. Optionally, the liquid carrier is selected from ethylene diamine, diethylenetriamine, triethylenetetramine, pyrrolidine, n-butylamine and mixtures thereof. Optionally, the liquid carrier is selected from ethylene diamine, diethylenetriamine and mixtures thereof. Optionally, the liquid carrier is ethylene diamine.

Optionally, the selenium/Group 1b ink of the present invention is a non-aqueous ink (i.e., contains ≤10 wt %, more preferably ≤1 wt %, most preferably ≤0.1 wt % water).

The selenium/Group 1b ink of the present invention can, optionally, further comprise a cosolvent. Cosolvents suitable for use with the present invention are miscible with the liquid carrier and any liquid vehicles contained in the selenium/Group 1b ink. Preferred cosolvents exhibit a boiling point within 30° C. of the boiling point of the liquid carrier and any liquid vehicles contained in the selenium/Group 1b ink.

The selenium/Group 1b ink of the present invention can, optionally, further comprise at least one optional additive selected from a dispersant, a wetting agent, a polymer, a binder, an anti-foaming agent, an emulsifying agent, a drying agent, a filler, an extender, a film conditioning agent, an antioxidant, a plasticizer, a preservative, a thickening agent, a flow control agent, a leveling agent, a corrosion inhibitor and a dopant (e.g., sodium to improve electrical performance of CIGS materials). Optional additives can be incorporated into the selenium/Group 1b ink of the present invention to, for example, facilitate increased shelf life, to improve flow characteristics to facilitate the method of application to a substrate (e.g., printing, spraying), to modify the wetting/spreading characteristics of the ink onto the substrate, to enhance the compatibility of the selenium/Group 1b ink with other inks used to deposit other components on the substrate (e.g., other constituents of a CIGS material, such as In, Ga, and S), and to modify the decomposition temperature of the selenium/Group 1b ink.

The selenium content of the selenium/Group 1b ink of the present invention can be selectively provided to suit the particular application need and the processing technology and equipment to be used to apply the selenium/Group 1b ink to a given substrate. Optionally, the selenium/Group 1b ink exhibits a selenium content selected from 1 to 50 wt %; 1 to 5 wt %; 4 to 15 wt % and 5 to 10 wt % (based on the weight of the selenium/Group 1b ink). Optionally, the selenium/Group 1b ink exhibits a selenium content of 1 to 50 wt % (based on the weight of the selenium/Group 1b ink). Optionally, the selenium/Group 1b ink exhibits a selenium content of 1 to 5 wt % (based on the weight of the selenium/Group 1b ink). Optionally, the selenium/Group 1b ink exhibits a selenium content of 4 to 15 wt % (based on the weight of the selenium/Group 1b ink). Optionally, the selenium/Group 1b ink exhibits a selenium content of 5 to 10 wt % (based on the weight of the selenium/Group 1b ink).

Optionally, the mole ratio of selenium to Group 1b material in the selenium/Group 1b ink of the present invention is tailorable. Optionally, the mole ratio of the selenium to Group 1b material in the selenium/Group 1b ink of the present invention is tailorable from 6:1 to 1:6. Optionally, the mole ratio of the selenium to Group 1b material in the selenium/Group 1b ink of the present invention is tailorable from 3:1 to 1:3. Optionally, the mole ratio of selenium to Group 1b material in the selenium/Group 1b ink of the present invention is tailorable from 2:1 to 1:2. Optionally, the mole ratio of the selenium to Group 1b material in the selenium/Group 1b ink of the present invention is tailorable 1.5:1 to 1:1.5.

Without wishing to be bound by theory, it is believed that the stability of the selenium/Group 1b ink is determined by four main factors, namely 1) the solubility of the Group 1b component in the liquid carrier; 2) selection of R, R' and $R^2$ in the organic chalcogenide component; 3) selection of the molar ratio of the organic chalcogenide component to selenium in the selenium component; 4) selection of the liquid carrier; and, 5) coordination of the Group 1b material in the Group 1b component by ligands capable of regulating reaction of the Group 1b material with selenium in the liquid carrier. By judicious selection and control of these five main factors, it is possible to tailor the stability of the selenium/Group 1b ink for a given application. That is, the desired stability may vary depending on the method to be used to deposit the selenium/Group 1b ink onto a substrate. In some cases, it may be desirable to mix the selenium component and the Group 1b component well in advance of the time when the selenium/Group 1b ink is to be deposited onto a substrate (e.g., days or weeks). In these situations, the selenium/Group 1b ink can be formulated to exhibit extended stability. In some cases, it may be desirable for the customer/user to combine the selenium component and the Group 1b component shortly before the selenium/Group 1b ink is to be deposited onto a substrate (e.g., within 30 minutes of deposition onto a substrate). In these situations, the selenium/Group 1b ink can be formulated to be at least storage stable. In some cases, it may be desirable for the customer/user to combine the selenium component and the Group 1b component contemporaneously with the deposition of the selenium/Group 1b ink onto a substrate (e.g., simultaneous co-deposition of the selenium component and the Group 1b component wherein the components are mixed momentarily before or as they contact the substrate). In these situations, the selenium/Group 1b ink can be formulated to be at least stable.

A method of preparing a selenium/Group 1b ink of the present invention, comprises: providing a selenium component; optionally, providing an organic chalcogenide component; providing a Group 1b component; providing a liquid carrier; and forming a combination of the selenium component, the optional organic chalcogenide component the Group 1b component and the liquid carrier, providing the selenium/Group 1b ink.

In providing the selenium component for use in the preparation of the selenium/Group 1b ink of the present invention, the selenium and the liquid carrier are combined by adding the liquid carrier to the selenium. More preferably, the selenium and liquid carrier are combined using inert techniques, followed with continuous agitation and heating to reflux until the selenium is dissolved in the liquid carrier. Preferably, the liquid carrier is maintained at a temperature of 20 to 240° C. during the combining of the liquid carrier and the selenium powder. Optionally, the liquid carrier and selenium can be heated above the melting point of selenium (220° C.) during the combining process.

Providing a combined selenium/organic chalcogenide component for use in the preparation of the selenium/Group 1b ink of the present invention, comprises: providing selenium, providing an organic chalcogenide having a formula selected from RZ—Z'R' and $R^2$—SH, and providing a liquid carrier; combining the selenium, the organic chalcogenide and the liquid carrier; heating the combination (preferably to a temperature within 25° C. of the boiling point temperature of the liquid carrier, most preferably to heating to reflux) with agitation (preferably for a period of 0.1 to 40 hrs) to form the combined selenium/organic chalcogenide component stably dispersed in the liquid carrier. Preferably, the molar ratio of selenium to the organic chalcogenide having a formula selected from RZ—Z'R' and $R^2$—SH in the combined selenium/organic chalcogenide component is 2:1 to 20:1, more preferably 2:1 to 14:1, still more preferably 2:1 to 10:1, most preferably 2:1 to 6:1.

In providing the combined selenium/organic chalcogenide component for use in the preparation of the selenium/Group 1b ink of the present invention, the organic chalcogenide provided is selected from a thiol and an organic dichalcogenide. When a thiol is used, the thiol preferably has a formula $R^2$—SH, wherein $R^2$ is selected from a $C_{1-20}$ alkyl group, a $C_{6-20}$ aryl group, a $C_{1-20}$ alkylhydroxy group, an arylether group and an alkylether group; preferably $R^2$ is selected from a $C_{1-20}$ alkyl group, a $C_{6-20}$ aryl group, a $C_{1-20}$ alkylhydroxy group, a $C_{7-20}$ arylether group and a $C_{3-20}$ alkylether group; more preferably $R^2$ is selected from a $C_{1-20}$ alkyl group and a $C_{6-20}$ aryl group; still more preferably $R^2$ is a $C_{1-10}$ alkyl group; most preferably $R^2$ is a $C_{1-5}$ alkyl group. When an organic dichalcogenide is used, the organic dichalcogenide preferably has a formula RZ—Z'R', wherein R is selected from H, a $C_{1-20}$ alkyl group, a $C_{6-20}$ aryl group, a $C_{1-20}$ alkylhydroxy group, an arylether group and an alkylether group (preferably R is selected from a $C_{1-20}$ alkyl group, a $C_{6-20}$ aryl group, a $C_{1-20}$ alkylhydroxy group, a $C_{7-20}$ arylether group and a $C_{3-20}$ alkylether group; more preferably R is selected from a $C_{1-20}$ alkyl group and a $C_{6-20}$ aryl group; still more preferably R is a $C_{1-10}$ alkyl group; most preferably R is a $C_{1-5}$ alkyl group); wherein R' is selected from a $C_{1-20}$ alkyl group, a $C_{6-20}$ aryl group, a $C_{1-20}$ alkylhydroxy group, an arylether group and an alkylether group (preferably R' is selected from a $C_{1-20}$ alkyl group, a $C_{6-20}$ aryl group, a $C_{1-20}$ alkylhydroxy group, a $C_{7-20}$ arylether group and a $C_{3-20}$ alkylether group; more preferably R' is selected from a $C_{1-20}$ alkyl group and a $C_{6-20}$ aryl group; still more preferably R' is a $C_{1-10}$ alkyl group; most preferably R' is a $C_{1-5}$ alkyl group); and, wherein Z and Z' are each independently selected from sulfur, selenium and tellurium; preferably sulfur and selenium; most preferably sulfur. The $R^2$, R and R' groups in the thiol and organic dichalcogenide used can be selected to enhance the solubility of the resulting combined selenium/organic chalcogenide component in the liquid carrier.

Preferably, in providing the combined selenium/organic chalcogenide component for use in the preparation of the selenium/Group 1b ink of the present invention, the timing of the addition of the organic chalcogenide depends on the physical state of the organic chalcogenide used. For solid organic chalcogenides, the solid organic chalcogenide is preferably combined with the selenium before addition of the liquid carrier. For liquid organic chalcogenides, the liquid organic chalcogenide is preferably added to the combined selenium and liquid carrier.

When using a liquid organic chalcogenide, providing the combined selenium/organic chalcogenide component for use in the preparation of the selenium/Group 1b ink of the present invention, optionally, further comprises heating the combined selenium and liquid carrier before adding the liquid organic chalcogenide. Preferably, providing the combined selenium/organic chalcogenide component for use in preparation of the selenium/Group 1b ink of the present invention, optionally, further comprises: heating the combined liquid carrier and selenium powder before and during the addition of the liquid organic chalcogenide. More preferably, the combined liquid carrier and selenium powder are maintained at a temperature of 20 to 240° C. during the addition of the liquid organic chalcogenide. Most preferably, any liquid organic chalcogenides are added to the combined selenium and liquid carrier by gradually adding the liquid organic chalcogenide to the combined selenium and liquid carrier with continuous agitation and heating to reflux.

The Group 1b component can, optionally, be prepared by combining simple salts of silver or copper with a multidentate ligand in an appropriate liquid carrier. For instance, copper carboxylate salts can be reacted with a multidentate amine in an appropriate liquid carrier to give a copper amide complex plus ammonium carboxylate salts dispersed in the liquid carrier.

In providing the selenium component and the Group 1b component for use in the preparation of the selenium/Group 1b ink of the present invention, the liquid carrier used is any solvent or combination of solvents in which the selenium component and the Group 1b component are stably dispersible. Optionally, the liquid carrier used is selected from water, ethers, polyethers, amide solvents (e.g., dimethylformamide, dimethylacetamide), N-methylpyrrolidone, keto-solvents (e.g., methylisobutylketone), aryl solvents (e.g., toluene), cresols, xylene and mixtures thereof. Optionally, the liquid carrier used is selected from ethers, polyethers, amide solvents (e.g., dimethylformamide, dimethylacetamide), N-methylpyrrolidone, keto-solvents (e.g., methylisobutylketone), aryl solvents (e.g., toluene), cresols, xylene and mixtures thereof. Optionally, the liquid carrier is a nitrogen containing solvent or a mixture of nitrogen containing solvents. Optionally, the liquid carrier used comprises a liquid amine having a formula $NR_3$, wherein each R is independently selected from a H, a $C_{1-10}$ alkyl group, a $C_{6-10}$ aryl group, a $C_{3-10}$ cycloalkylamino group (e.g., 1,2-diamino cyclohexane) and a $C_{1-10}$ alkylamino group. Optionally, the liquid carrier used is selected from ethylene diamine; diethylenetriamine; tris(2-aminoethyl)amine; triethylenetetramine; n-butylamine; n-hexylamine; octylamine; 2-ethyl-1-hexylamine; 3-amino-1-propanol; 1,3-diaminopropane; 1,2-diaminopropane; 1,2-diaminocyclohexane; pyridine; pyrrolidine; 1-methylimidazole; tetramethylguanidine and mixtures thereof. Optionally, the liquid carrier used is selected from ethylene diamine, diethylenetriamine, triethylenetetramine, n-hexylamine, pyrrolidine, n-butylamine and mixtures thereof. Optionally, the liquid carrier used is selected from ethylene diamine, diethylenetriamine, triethylenetetramine, pyrrolidine, n-butylamine and mixtures thereof. Optionally, the liquid carrier used is selected from ethylene diamine, diethylenetriamine and mixtures thereof.

Optionally, the method of preparing the selenium/Group 1b ink of the present invention, further comprises: providing a cosolvent; and, combining the cosolvent with the selenium component, the Group 1b component and the liquid carrier.

Optionally, the method of preparing the selenium/Group 1b ink of the present invention, further comprises: providing at least one optional additive; and, combining the at least one optional additive with the liquid carrier; wherein the at least one optional additive is selected from a dispersant, a wetting agent, a polymer, a binder, an anti-foaming agent, an emulsifying agent, a drying agent, a filler, an extender, a film conditioning agent, an antioxidant, a plasticizer, a preservative, a thickening agent, a flow control agent, a leveling agent, a corrosion inhibitor and a dopant.

The selenium/Group 1b ink of the present invention can be used in the preparation of CIGS layers for use in thin layer photovoltaic cells. In particular, the selenium/Group 1b ink of the present invention can be used to apply selenium and a Group 1b material on a substrate to facilitate the preparation of a CIGS layer. Optionally, the selenium/Group 1b ink of the present invention can be used to apply a $M_aSe_h$ material on a substrate.

The method of applying a $M_aSe_h$ material on a substrate using the selenium/Group 1b ink of the present invention, comprises: providing a substrate; providing a selenium/Group 1b ink of the present invention and applying the selenium/Group 1b ink to the substrate forming a $M_aSe_h$ precursor on the substrate; treating the $M_aSe_h$ precursor to remove the liquid carrier depositing a $M_aSe_h$ material on the substrate; wherein the mole ratio of M to selenium in the selenium/Group 1b ink is 6:1 to 1:6 (preferably 3:1 to 1:3; more preferably 2:1 to 1:2); and wherein M is at least one of copper and silver (preferably copper). Preferably, the $M_aSe_h$ material deposited on the substrate is selected from $Ag_2Se$, $AgSe$, $AgSe_2$, $Cu_2Se$, $CuSe$, $CuSe_2$ and Se. Preferably, the mole ratio of M to selenium in the selenium/Group 1b ink is 2:1 to 1:2, wherein ≥25 wt %, more preferably ≥80 wt %, most preferably ≥90 wt % of the $M_aSe_h$ material deposited on the substrate is selected from $Ag_2Se$, $AgSe$, $AgSe_2$, $Cu_2Se$, $CuSe$ and $CuSe_2$; preferably $Cu_2Se$, $CuSe$ and $CuSe_2$. More preferably, M is copper and the mole ratio of M to selenium in the selenium/Group 1b ink is selected from (a) 2:1, wherein ≥80 wt % of the $M_aSe_h$ material deposited on the substrate is $Cu_2Se$; (b) 1:1, wherein ≥80 wt % of the $M_aSe_h$ material deposited on the substrate is CuSe; and (c) 1:2, wherein ≥80 wt % of the $M_aSe_h$ material deposited on the substrate is $CuSe_2$.

In the method of preparing a $M_aSe_h$ material on a substrate using a selenium/Group 1b ink of the present invention, the selenium/Group 1b ink of the present invention can be applied to the substrate using conventional liquid processing techniques such as wet coating, spray coating, spin coating, doctor blade coating, contact printing, top feed reverse printing, bottom feed reverse printing, nozzle feed reverse printing, gravure printing, microgravure printing, reverse microgravure printing, comma direct printing, roller coating, slot die coating, meyerbar coating, lip direct coating, dual lip direct coating, capillary coating, ink jet printing, jet deposition, spray pyrolysis and spray deposition. Optionally, the selenium/Group 1b ink of the present invention can be applied to the substrate using conventional spray pyrolysis techniques. Preferably, the selenium/Group 1b ink of the present invention is applied to the substrate under an inert atmosphere (e.g., under nitrogen).

The method of preparing a Group 1a-1b-3a-6a material, comprises: providing a substrate; optionally, providing a Group 1a source comprising sodium; providing a selenium/Group 1b ink of the present invention; providing a Group 3a source; optionally, providing a Group 6a source; forming at least one Group 1a-1b-3a-6a precursor material on the substrate by optionally using the Group 1a source to apply sodium to the substrate; using the selenium/Group 1b source to apply selenium and a Group 1b material to the substrate, wherein the Group 1b material selected from copper and silver (preferably copper); using the Group 3a source to apply a Group 3a material to the substrate; optionally, using the Group 6a source to apply at least one of sulfur and selenium to the substrate; treating the precursor material to form a Group 1a-1b-3a-6a material having a formula $Na_LX_mY_nS_pSe_q$; wherein X is at least one Group 1b material selected from copper and silver (preferably copper); Y is at least one Group 3a material selected from aluminum, gallium and indium (preferably indium and gallium); 0≤L≤0.75; 0.25≤m≤1.5; n is 1; 0≤p<2.5; and, 0<q≤2.5. Preferably, 0.5≤(L+m)≤1.5 and 1.8≤(p+q)≤2.5. Preferably, Y is $(In_{1-b}Ga_b)$, wherein 0≤b≤1. More preferably, the Group 1a-1b-3a-6a material is according to the formula $Na_LCu_mIn_{(1-d)}Ga_dS_{(2+e)(1-f)}Se_{(2+e)f}$; wherein 0≤L≤0.75, 0.25≤m≤1.5, 0≤d≤1, −0.2≤e≤0.5, 0<f≤1; wherein 0.5≤(L+m)≤1.5 and 1.8≤{(2+e)f+(2+e)(1−f)}≤2.5. Optionally, one or more of the Group 1a source, the selenium/Group 1b ink, the Group 3a source and the Group 6a source of the present invention are combined before application to the substrate. The components of the precursor material can be treated by known methods to form the Group 1a-1b-3a-6a material having formula $Na_LX_mY_nS_pSe_q$. The components of the precursor material can be treated individually or in various combinations. Annealing temperatures for the deposited components can range from 200 to 650° C. with annealing times of 0.5 to 60 minutes. Optionally, additional Group 6a material can be introduced during the annealing process in the form of at least one of a selenium ink, selenium vapor, selenium powder, hydrogen selenide gas, sulfur powder and hydrogen sulfide gas. The precursor materials can optionally be heated to the annealing temperature by use of a rapid thermal processing protocol, such as with the use of a high-powered quartz lamp, a laser or microwave heating methods. The precursor materials can optionally be heated to the annealing temperature using traditional heating methods, for example in a furnace.

Preferably, the selenium/Group 1b ink used in preparing the Group 1a-1b-3a material is tailored to deposit a $M_aSe_h$ material on the substrate, wherein the mole ratio of M to Se in the selenium/Group 1b ink is 6:1 to 1:6 (preferably 3:1 to 1:3, more preferably 2:1 to 1:2) and wherein M is at least one Group 1b material selected from copper and silver, preferably copper. Variation of the molar ratio of the selenium in the selenium component to the Group 1b material in the Group 1b component of the selenium/Group 1b ink provides selectability of the $M_aSe_h$ material deposited using the selenium/Group 1b ink of the present invention. For example, a 1:1 molar ratio of the selenium in the selenium component to the Group 1b material in the Group 1b component in the selenium/Group 1b ink facilitates the deposition of predominantly a MSe material. A 2:1 molar ratio of the selenium in the selenium component to the Group 1b material in the Group 1b component in the selenium/Group 1b ink facilitates the deposition of predominantly a $MSe_2$ material. A 1:2 molar ratio of the selenium in the selenium component to the Group 1b material in the Group 1b component in the selenium/Group 1b ink facilitates the deposition of predominantly a $M_2Se$ material.

A preferred type of Group 1a-1b-3a-6a material is a CIGS material. A preferred method of the present invention comprises a method for preparing a CIGS material, comprising: providing a substrate; providing a selenium/Group 1b ink of the present invention, wherein the Group 1b component comprises copper; optionally, providing an indium source; optionally, providing a gallium source; optionally, providing a sulfur source and optionally, providing a selenium source; forming at least one CIGS precursor layer on the substrate by depositing copper and selenium on the substrate using the selenium/Group 1b ink of the present invention; optionally, depositing an indium material on the substrate using the indium source; optionally, depositing a gallium material on the substrate using the gallium source; optionally, depositing a sulfur material on the substrate using the sulfur source and optionally, depositing a selenium material on the substrate using the selenium source; treating the at least one CIGS precursor layer to form a CIGS material having a formula $Cu_v In_w Ga_x Se_y S_z$; wherein $0.5 \leq v \leq 1.5$ (preferably $0.85 \leq v \leq 0.95$), $0 \leq w \leq 1$ (preferably $0.68 \leq w \leq 0.75$, more preferably w is 0.7), $0 \leq x \leq 1$ (preferably $0.25 \leq x \leq 0.32$, more preferably x is 0.3), $0 < y \leq 2.5$; and, $0 \leq z < 2.5$. Preferably $(w+x)=1$ and $1.8 \leq (y+z) \leq 2.5$. More preferably, the CIGS material prepared has a formula $CuIn_{1-b} Ga_b Se_{2-c} S_c$, wherein $0 \leq b \leq 1$ and $0 \leq c < 2$. The components of the CIGS precursor layer(s) can be treated by known methods to form the CIGS material having formula $Cu_v In_w Ga_x S_y Se_z$. When multiple CIGS precursor layers are applied, the layers can be treated individually or in various combinations. For example, a selenium/Group 1b ink of the present invention and at least one of an indium source and a gallium source can be sequentially- or co-deposited on a substrate to form a CIGS precursor layer, followed by heating of the precursor layer to a temperature of 200 to 650° C. for 0.5 to 60 minutes; followed by deposition onto the substrate of another CIGS precursor layer using more selenium/Group 1b ink of the present invention and at least one of an indium source and a gallium source, followed by heating to a temperature of 200 to 650° C. for 0.5 to 60 minutes. In another approach, the components of the CIGS precursor layer(s) are all applied to the substrate before annealing. Annealing temperatures can range from 200 to 650° C. with annealing times of 0.5 to 60 minutes. Optionally, additional selenium can be introduced during the annealing process in the form of at least one of selenium ink, selenium powder and hydrogen selenide gas. The CIGS precursor layer(s) can optionally be heated to the annealing temperature by use of a rapid thermal processing protocol, such as with the use of a high-powered quartz lamp, a laser or microwave heating methods. The CIGS precursor layer(s) can optionally be heated to the annealing temperature using traditional heating methods, for example in a furnace.

Preferably, the selenium/Group 1b ink used in preparing the CIGS material is tailored to deposit a $Cu_a Se_h$ material on the substrate, wherein the mole ratio of copper to selenium in the selenium/Group 1b ink is 6:1 to 1:6 (preferably 3:1 to 1:3, more preferably 2:1 to 1:2). Variation of the molar ratio of the selenium in the selenium component to the copper in the Group 1b component of the selenium/Group 1b ink provides selectability of the $Cu_a Se_h$ material deposited using the selenium/Group 1b ink of the present invention. For example, a 1:1 molar ratio of the selenium in the selenium component to the copper in the Group 1b component in the selenium/Group 1b ink facilitates the deposition of predominantly a CuSe material. A 2:1 molar ratio of the selenium in the selenium component to the copper in the Group 1b component in the selenium/Group 1b ink facilitates the deposition of predominantly a $CuSe_2$ material. A 1:2 molar ratio of the selenium in the selenium component to the copper in the Group 1b component in the selenium/Group 1b ink facilitates the deposition of predominantly a $Cu_2Se$ material.

Optionally, at least two of the selenium/Group 1b ink, the optional indium source, the optional gallium source, the optional sulfur source and the optional selenium source can be combined before using them to deposit material on the substrate. Optionally, at least three of the selenium/Group 1b ink, the optional indium source, the optional gallium source, the optional sulfur source and the optional selenium source can be combined before using them to deposit material on the substrate. Optionally, the selenium/Group 1b ink, the optional indium source, the optional gallium source, the optional sulfur source and the optional selenium source are combined before using them to deposit material on the substrate.

Optionally, at least two of the $M_a Se_h$ material, the optional indium material, the optional gallium material, the optional sulfur material and the optional selenium material are codeposited on the substrate to provide the desired CIGS material composition. The term "codeposited" as used herein and in the appended claims means that the $M_a Se_h$ material, the optional indium material, the optional gallium material, the optional sulfur material and the optional selenium material that are being codeposited on the substrate are simultaneously, separately deposited on the substrate (i.e., the materials are combined immediately before, or simultaneously as, they are being deposited on the substrate).

To facilitate the combination of one or more material sources with the selenium/Group 1b ink of the present invention prior to deposition on a substrate or to facilitate the codeposition of one or more material sources with the selenium/Group 1b ink of the present invention, the material sources used and the selenium/Group 1b ink are preferably formulated to exhibit similar decomposition temperatures. Preferably, the decomposition temperatures (i.e., boiling point temperatures for the liquid carrier, any co-solvents and any liquid vehicle(s)) of the combined or codeposited material source(s) and the selenium/Group 1b ink are within 50° C., more preferably within 25° C.

Group 1a sources suitable for use in accordance with the present invention include any conventional vehicles for depositing sodium (a Group 1a material) on a substrate using liquid deposition techniques, vacuum-evaporation techniques, chemical vapor deposition techniques, sputtering techniques or any other conventional process for depositing sodium on a substrate that is compatible with the selenium/Group 1b ink of the present invention.

Group 3a sources suitable for use in accordance with the present invention include any conventional vehicles for depositing a Group 3a material on a substrate using liquid deposition techniques, vacuum-evaporation techniques, chemical vapor deposition techniques, sputtering techniques or any other conventional process for depositing a Group 3a material onto a substrate that is compatible with the selenium/Group 1b ink of the present invention. Optionally, the Group 3a source contains selenium in addition to the Group 3a material (e.g., InSe, GaSe). Optionally, the Group 3a source contains copper and selenium in addition to the Group 3a material (e.g., CIGS nanoparticles).

Group 6a sources suitable for use in accordance with the present invention include any conventional vehicles for depositing a Group 6a material selected from sulfur and selenium on a substrate using liquid deposition techniques, vacuum-evaporation techniques, chemical vapor deposition techniques, sputtering techniques or any other conventional process for depositing a Group 6a material selected from sulfur and selenium onto a substrate that is compatible with the selenium/Group 1b ink of the present invention.

Liquid vehicles used in the Group 1b component, the Group 1a source, the Group 3a source and Group 6a source can include amines, amides, alcohols, water, ketones, unsaturated hydrocarbons, saturated hydrocarbons, mineral acids, organic acids, organic bases (preferably the liquid vehicles used are selected from alcohols, amines, amides, water, ketone, ether, aldehydes and alkenes; most preferably the liquid vehicles are amines).

The substrate used in the methods of the present invention can be selected from conventional materials used in conjunction with the preparation of a CIGS material for use in a photovoltaic device, preferably molybdenum. In some applications, the substrate can be a coating on a carrier substance, such as, glass, foil, and plastic (e.g., polyethylene terephthalate and polyimides). Optionally, the substrate is sufficiently flexible to facilitate roll-to-roll production of CIGS materials for use in photovoltaic devices.

In the method of the present invention for forming a CIGS material on a substrate, 1 to 20 CIGS precursor layers are deposited on the substrate to form the CIGS material. Preferably 2 to 8, CIGS precursor layers are deposited on the substrate to form the CIGS material. The individual CIGS precursor layers each comprise at least one of copper, silver, gallium, indium, sulfur and selenium. Optionally, at least one of the CIGS precursor layers comprise at least one Group 1b material selected from copper and silver; at least one Group 3a material selected from gallium and indium; selenium and, optionally, sulfur.

material for use in photovoltaic devices to facilitate improved separation of the photogenerated charge carriers and to facilitate reduced recombination at the back contact. Accordingly, it is believed to be desirable to tailor the CIGS material composition to achieve the desired grain structure and the highest efficiency photovoltaic device characteristics.

EXAMPLES 1-10

Group 1b Component Preparation

Group 1b component complexes were prepared using the components and amounts identified in Table 1 using the following method. Copper (II) formate hydrate was weighed out into a reaction vessel in air. The reaction vessel was then purged with nitrogen. The liquid vehicle was then added without agitation to the reaction vessel using inert techniques in a glove box. Optional additional ligands identified in Table 1 were then added to the reaction vessel using inert techniques. The contents of the reaction vessel were then stirred and heated on a hotplate set at 80° C. until all of the copper (II) formate hydrate dissolved. The contents of the reaction vessel were then cooled to room temperature. The contents of the reaction vessel were then stored under nitrogen at room temperature (unless specifically indicated otherwise in Table 1). Observations of the product formed upon storage are provided in Table 1.

TABLE 1

| Ex | Cu(II) formate hydrate | Liquid Vehicle ("LV") | Mass LV (mg) | Ligand ("LG") | Mass LG (mg) | Observations initial | 16 hrs | 6 hrs 4° C. | 5 days | 8 days |
|----|---|---|---|---|---|---|---|---|---|---|
| 1  | 10 mg  | ethylene diamine    | 330  | —    | —   | A | — | — | — | — |
| 2  | 10 mg  | DETA                | 330  | —    | —   | A | — | — | — | — |
| 3  | 10 mg  | n-butyl amine       | 330  | —    | —   | A | — | — | — | — |
| 4  | 29 mg  | ethylene diamine    | 370  | —    | —   | A | A | B | C | C |
| 5  | 29 mg  | 1,4-diamino butane  | 370  | —    | —   | C | C | C | C | C |
| 6  | 29 mg  | ethylene diamine    | 330  | DETA | 39  | A | A | A | A | A |
| 7  | 29 mg  | ethylene diamine    | 320  | TETA | 55  | A | A | C | C | C |
| 8  | 29 mg  | ethylene diamine    | 350  | DETA | 30  | A | A | C | A | A |
| 9  | 29 mg  | ethylene diamine    | 340  | TETA | 36  | A | A | C | C | C |
| 10 | 480 mg | ethylene diamine    | 3870 | DETA | 650 | A | — | — | — | — |

A—all dissolved
B—frozen solid
C—not dissolved, precipitate present

Using the method of depositing a selenium/Group 1b ink of the present invention, it is possible to provide uniform or graded semiconductor films comprising selenium and at least one of copper and silver (e.g., a CIGS material). For example, a graded CIGS material can be prepared by depositing varying concentrations of the components deposited (i.e., by depositing multiple layers of the precursor materials in different compositions). In the preparation of CIGS materials it is sometimes desirable to provide graded films (e.g., with respect to Ga concentration). It is conventional to provide a graded Ga/(Ga+In) ratio as a function of depth in a CIGS

EXAMPLES 11-15

Combined Selenium/Organic Chalcogenide Component Preparation

Selenium components were prepared using the components and amounts identified in Table 2 using the following method. Selenium powder was weighed out into a reaction vessel in air. The reaction vessel was then purged with nitrogen. The liquid carrier was then added without agitation to the reaction vessel using inert techniques in a glove box. The liquid organic dichalcogenide was then added to the reaction vessel using inert techniques (i.e., via a syringe through a rubber septa). The contents of the reaction vessel were then treated according to the reaction conditions set forth in Table 2. Observations regarding the product formed are provided in Table 2. Formation of a selenium component was indicated by a distinctive brown color formation in the liquid carrier and a lack of solids on the bottom of the reaction vessel. Note that some selenium components are air sensitive and will decompose upon exposure to air. Accordingly, the selenium components were prepared and stored in a nitrogen atmosphere.

TABLE 2

| Ex. | Se (g) | Organic di-chalcogenide ("OD") | Mass OD (g) | Liquid Carrier ("LC") | Mass LC (g) | react. cond. | observ. |
|---|---|---|---|---|---|---|---|
| 11 | 0.112 | di-t-butyl disulfide | 0.063 | ethylene diamine | 3.33 | D | F |
| 12 | 0.361 | dibutyl disulfide | 0.163 | ethylene diamine | 2.98 | E | F |
| 13 | 2.0 | di-t-butyl disulfide | 1.13 | ethylene diamine | 46.87 | G | F |
| 14 | 2.0 | di-t-butyl disulfide | 0.75 | ethylene diamine | 47.25 | G | F |
| 15 | 2.0 | di-t-butyl disulfide | 0.56 | ethylene diamine | 47.44 | G | F |

D. Heated contents of reaction vessel with agitation and reflux on hot plate set at 120° C. for 4 hours; raised hot plate set point temperature to 130° C. for 8 hrs.
E. Heated contents of reaction vessel with agitation and reflux on hot plate set at 80° C. for 2 hours; raised hot plate set point temperature to 125° C. and continued heating for 2.3 hrs; raised hot plate set point temperature to 135° C. and continued heating for 3.2 hrs.
F. Brown liquid. No solids observed upon reaction completion.
G. Heated contents of reaction vessel with agitation using a heating mantle. Reactor vessel contents were refluxed (b.p. EDA is 118° C.) for 6 hrs under nitrogen. Reactor vessel contents were then transferred to a storage container via cannula upon reaction completion.

EXAMPLES 16-27

Selenium/Group 1b Ink Preparation

In a nitrogen glove box the combined selenium/organic chalcogenide component ("Se/OC comp.") and Group 1b component identified in Table 3 were combined to form a selenium/Group 1b ink. The observed stability of the selenium/Group 1b inks formed is described in Table 3.

TABLE 3

| | Se/OC Comp. | | Group 1b Comp. | | Observ. | | |
|---|---|---|---|---|---|---|---|
| Ex. | (g) | From Ex. # | (g) | From Ex. # | Initial (upon preparation) | 1 day | Other |
| 16 | 0.34 | 1 | 0.33 | 11 | G | — | H |
| 17 | 0.34 | 2 | 0.33 | 11 | G | — | I |
| 18 | 0.34 | 1 | 0.048 | 12 | G | — | J |
| 19 | 0.34 | 3 | 0.048 | 12 | K | — | — |
| 20 | 0.34 | 3 | 0.155 | 12 | K | — | — |
| 21 | 0.123 | 10 | 0.077 | 13 | G | G | L |
| 22 | 0.089 | 10 | 0.111 | 13 | G | G | L |
| 23 | 0.057 | 10 | 0.143 | 13 | G | G | L |
| 24 | 0.089 | 10 | 0.111 | 14 | G | G | N |
| 25 | 0.057 | 10 | 0.143 | 14 | G | G | N |
| 26 | 0.089 | 10 | 0.111 | 15 | G | G | N |
| 27 | 0.057 | 10 | 0.143 | 15 | G | M | N |

G. No visible precipitate.
H. No visible precipitate after 5 days storage @ room temperature under nitrogen.
I. No visible precipitate after 11 days storage @ room temperature under nitrogen.
J. No visible precipitate after 30 minutes @ room temperature under nitrogen, but precipitate formed by next day.
K. Precipitate formed immediately upon combination of selenium component and Group 1b component.
L. No visible precipitate after 13 days storage @ room temperature under nitrogen.
M. Crystal formation (visible precipitate).
N. Crystal formation observed after 5 days @ room temperature under nitrogen.

EXAMPLE 28

Deposition of $Cu_2Se$ on Substrate

The following procedure was performed in a glove box under a nitrogen atmosphere. A 1×1 cm substrate (molybdenum coated glass slide) was preheated on the center of a hotplate set at 100° C. Two drops of the selenium/Group 1b ink prepared according to Example 21 were deposited on the preheated substrate. After the liquid components of the selenium/Group 1b ink evaporated, the hotplate temperature set point was raised to 250° C. Ten minutes after the temperature set point change, the substrate was moved a corner of the hotplate (slightly cooler than at the center) and the hotplate temperature set point was raised to 300° C. Five minutes later, the hotplate was turned off and the substrate was allowed to slowly cool to room temperature while still on the hotplate. The film formed on the substrate using the selenium/Group 1b ink was then analyzed by x-ray defraction (2-theta scan) using a Rigaku D/MAX 2500 at 50 kV/200 mA of nickel filtered copper Kα radiation. The sample was scanned from 5 to 90 degrees of 2θ in steps of 0.03 degrees at 0.75 degrees/minute. Reflection geometry was used and the sample was rotated at 20 RPM. The scan output was then compared with scans for compounds in standard crystallography databases to verify that the film formed was predominantly $Cu_2Se$ (i.e., $Cu_{1.8}Se$).

EXAMPLE 29

Deposition of CuSe on Substrate

The following procedure was performed in a glove box under a nitrogen atmosphere. A 1×1 cm substrate (molybdenum coated glass slide) was preheated on the center of a hotplate set at 100° C. Two drops of the selenium/Group 1b ink prepared according to Example 22 were deposited on the preheated substrate. After the liquid components of the selenium/Group 1b ink evaporated, the hotplate temperature set point was raised to 250° C. Ten minutes after the temperature set point change, the substrate was moved a corner of the hotplate (slightly cooler than at the center) and the hotplate temperature set point was raised to 300° C. Five minutes later, the hotplate was turned off and the substrate was allowed to slowly cool to room temperature while still on the hotplate. The film formed on the substrate using the selenium/Group 1b ink was determined to be predominantly CuSe using x-ray defraction as described in Example 28.

EXAMPLE 30

Deposition of $CuSe_2$ on Substrate

The following procedure was performed in a glove box under a nitrogen atmosphere. A 1×1 cm substrate (molybdenum coated glass slide) was preheated on the center of a hotplate set at 100° C. Two drops of the selenium/Group 1b ink prepared according to Example 23 were deposited on the preheated substrate. After the liquid components of the selenium/Group 1b ink evaporated, the hotplate temperature set point was raised to 250° C. Ten minutes after the temperature set point change, the substrate was moved a corner of the hotplate (slightly cooler than at the center) and the hotplate temperature set point was raised to 300° C. Five minutes later, the hotplate was turned off and the substrate was allowed to slowly cool to room temperature while still on the hotplate. The film formed on the substrate using the selenium/Group 1b ink was determined to be predominantly $CuSe_2$ and CuSe using x-ray defraction as described in Example 28.

EXAMPLE 31

Stability of Selenium Component

The selenium component prepared according to Example 11 noted in Table 2 was filtered through a 1.2 micron glass syringe filter 16 hours after synthesis of the ink in the liquid carrier. No aggregation or settling was observed in the container following the noted hold time of 16 hours and the selenium component in the liquid carrier passed through the filter with no hold up (i.e., all material passed through the filter).

We claim:

1. A method for preparing a Group 1a-1b-3a-6a material, comprising:

providing a substrate;

optionally, providing a Group 1a source comprising sodium;

providing a selenium/Group 1b ink, comprising, as initial components:
  a selenium component comprising selenium;
  an organic chalcogenide component having a formula selected from the group consisting of RZ—Z'R' and $R^2$—SH; wherein Z and Z' are each independently selected from the group consisting of sulfur, selenium and tellurium; wherein R is selected from the group consisting of H, $C_{1-20}$ alkyl group, a $C_{6-20}$ aryl group, a $C_{1-20}$ alkylhydroxy group, an arylether group and an alkylether group; wherein R' and $R^2$ are selected from the group consisting of a $C_{1-20}$ alkyl group, a $C_{6-20}$ aryl group, a $C_{1-20}$ alkylhydroxy group, an arylether group and an alkylether group;
  a Group 1b component, comprising at least one Group 1b material selected from the group consisting of copper and silver complexed with a multidentate ligand; wherein the Group 1b component comprises a copper (II) complex and a multidentate ligand selected from the group consisting of diethylenetriamine; tris(2-aminoethyl)amine; triethylenetetramine; tetraethylenepentamine and tetramethylguanidine;
  a liquid carrier, wherein the liquid carrier is selected from the group consisting of ethylene diamine; diethylenetriamine; tris(2-aminoethyl)amine; triethylenetetramine; n-butylamine; n-hexylamine; octylamine; 2-ethyl-1-hexylamine; 3-amino-1-propanol; 1,3-diaminopropane; 1,2-diaminopropane; 1,2-diaminocyclohexane; pyridine; pyrrolidine; 1-methylimidazole; tetramethylguanidine and mixtures thereof;
  wherein the selenium/Group 1b ink is stable; wherein the selenium and the Group 1b material do not form a precipitate during storage of the selenium/Group 1b ink at 22° C. under nitrogen for a period of at least sixteen (16) hours;

providing a Group 3a source;

optionally, providing a Group 6a source;

forming at least one Group 1a-1b-3a-6a precursor material on the substrate by optionally using the Group 1a source to apply sodium to the substate; using the selenium/Group 1b source to apply selenium and a Group 1b material to the substrate; using the Group 3a source to apply a Group 3a material to the substrate; optionally, using the Group 6a source to apply at least one of sulfur and selenium to the substrate;

treating the precursor material to form a Group 1a-1b-3a-6a material having a formula $Na_L X_m Y_n S_p Se_q$;

wherein X is at least one Group 1b element selected from the group consisting of copper and silver, Y is at least one Group 3a element selected the group consisting of aluminum, gallium and indium; $0 \leq L \leq 0.75$; $0.25 \leq m \leq 1.5$; n is 1; $0 \leq p < 2.5$; $0 < q \leq 2.5$; and, $1.8 \leq (p+q) \leq 2.5$.

2. The method of claim 1, wherein the organic chalcogenide component provided is according to the formula RZ—Z'R', where Z and Z' are both sulfur and where R and R' are each independently selected from the group consisting of a phenyl group, a methyl group, an ethyl group, a propyl group, an isopropyl group, a n-butyl group and a tert-butyl group.

3. The method of claim 2, where R and R' are both a tert-butyl group and wherein the provided liquid carrier is ethylene diamine.

* * * * *